(12) United States Patent
Yen et al.

(10) Patent No.: US 12,002,743 B2
(45) Date of Patent: Jun. 4, 2024

(54) ELECTRONIC CARRIER AND METHOD OF MANUFACTURING THE SAME

(71) Applicant: Advanced Semiconductor Engineering, Inc., Kaohsiung (TW)

(72) Inventors: You-Lung Yen, Taoyuan (TW); Bernd Karl Appelt, Holly Springs, NC (US)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 18 days.

(21) Appl. No.: 17/402,239

(22) Filed: Aug. 13, 2021

(65) Prior Publication Data

US 2023/0046889 A1 Feb. 16, 2023

(51) Int. Cl.
*H01L 23/00* (2006.01)
*H01L 21/48* (2006.01)
*H01L 23/498* (2006.01)

(52) U.S. Cl.
CPC .... *H01L 23/49833* (2013.01); *H01L 21/4857* (2013.01); *H01L 23/49822* (2013.01); *H01L 23/49838* (2013.01)

(58) Field of Classification Search
CPC .......... H01L 24/31; H01L 24/28; H01L 24/26
See application file for complete search history.

(56) References Cited

U.S. PATENT DOCUMENTS

| 2007/0035026 A1* | 2/2007 | Su ..................... H01L 21/76847 257/E21.578 |
| 2009/0096093 A1* | 4/2009 | Yang .................. H01L 23/5389 257/737 |
| 2010/0294547 A1* | 11/2010 | Hatanaka ............. H01R 12/714 29/877 |
| 2011/0309514 A1* | 12/2011 | Boomen ................. H01L 21/56 438/126 |
| 2018/0068978 A1* | 3/2018 | Jeng ........................ H01L 25/50 |
| 2019/0103360 A1* | 4/2019 | Yu ............................ H05K 1/00 |
| 2019/0139886 A1* | 5/2019 | Chen ....................... H01L 24/09 |
| 2022/0037248 A1* | 2/2022 | Choi ................... H01L 21/4857 |

FOREIGN PATENT DOCUMENTS

CN 101728353 A * 6/2010

* cited by examiner

*Primary Examiner* — Michele Fan
(74) *Attorney, Agent, or Firm* — FOLEY & LARDNER LLP

(57) ABSTRACT

An electronic carrier and a method of manufacturing an electronic carrier are provided. The electronic carrier includes a first interconnection structure and a second interconnection structure. The first interconnection structure includes a first patterned conductive layer having a first pattern density. The second interconnection structure is laminated to the first interconnection structure and includes a second patterned conductive layer having a second pattern density higher than the first pattern density. The first interconnection structure is electrically coupled to the second interconnection structure through a first non-soldering joint between and outside of the first interconnection structure and the second interconnection structure.

5 Claims, 16 Drawing Sheets

ELECTRONIC CARRIER AND METHOD OF MANUFACTURING THE SAME

BACKGROUND

1. Technical Field

The present disclosure relates generally to an electronic carrier and a method of manufacturing an electronic carrier.

2. Description of the Related Art

Quad flat non-lead packages (QFN) are widely used for IC packaging and IC assemblies; however, leadframe packages are limited to low input/output (I/O) counts. On the other hand, coreless substrates or interposers may be provided with multiple layers and high pin counts; however, coreless substrates or interposers usually suffer from high costs, warpage issues, low yields, and long cycle time.

SUMMARY

In one or more embodiments, an electronic carrier includes a first interconnection structure and a second interconnection structure. The first interconnection structure includes a first patterned conductive layer having a first pattern density. The second interconnection structure is laminated to the first interconnection structure and includes a second patterned conductive layer having a second pattern density higher than the first pattern density. The first interconnection structure is electrically coupled to the second interconnection structure through a first non-soldering joint between and outside of the first interconnection structure and the second interconnection structure.

In one or more embodiments, an electronic carrier includes a first substrate, a first conductive paste, and a second substrate. The first substrate includes a plurality of conductive portions. Each of the conductive portions has a first surface and a second surface opposite to the first surface. The first conductive paste is on the first surfaces of the conductive portions of the first substrate. The first surfaces of the conductive portions of the first substrate are substantially coplanar. The second substrate is bonded to the first substrate through the first conductive paste.

In one or more embodiments, an electronic carrier includes a first substrate, a second substrate, a first material, and a second material. The second substrate is disposed over the first substrate. The first material electrically connects the first substrate to the second substrate. The second material is disposed around the first material. The first material is cured earlier than the second material.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 5A1, FIG. 5A, FIG. 5B, FIG. 5C, FIG. 5D, FIG. 5E, and FIG. 5F illustrate various operations in a method of manufacturing an electronic carrier in accordance with some embodiments of the present disclosure; and FIG. 6A1, FIG. 6A, FIG. 6B, FIG. 6C, and FIG. 6D illustrate various operations in a method of manufacturing an electronic carrier in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
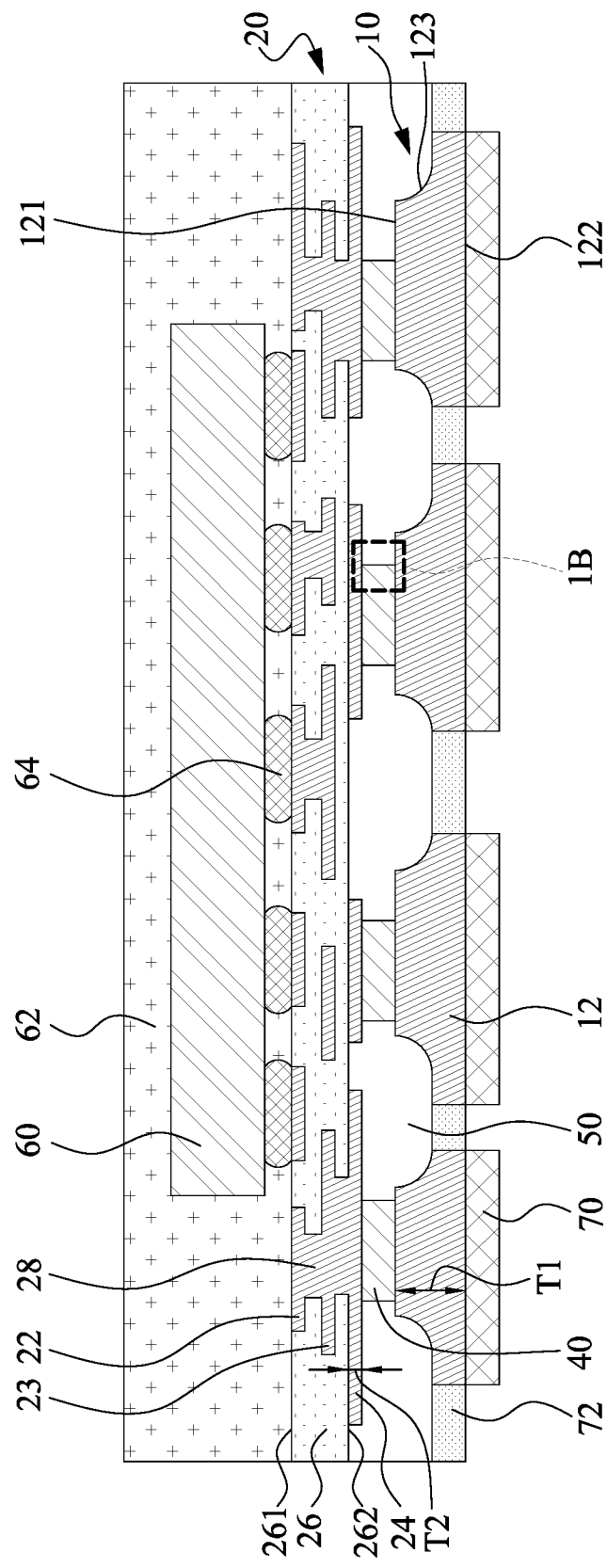
FIG. 1 illustrates a cross-sectional view of an electronic carrier in accordance with some embodiments of the present disclosure.

FIG. 1 illustrates a cross-sectional view of an electronic carrier 1 in accordance with some embodiments of the present disclosure. The electronic carrier 1 includes interconnection structures 10 and 20, a non-soldering joint 40, a dielectric structure 50, an electronic component 60, an encapsulant 62, conductive bumps 64, a solder mask 72, and conductive pads 70.

The interconnection structure 10 may include a patterned conductive layer. In some embodiments, the patterned conductive layer of the interconnection structure 10 includes a plurality of conductive portions 12. In some embodiments, the interconnection structure 10 has at least one contact port (i.e., conductive portions 12) at a side of the interconnection structure 10 and facing the interconnection structure 20. In some embodiments, each of the conductive portions 12 has a surface 121 and a surface 122 opposite to the surface 121. In some embodiments, the surfaces 121 of the conductive portions 12 are substantially coplanar. In some embodiments, the surfaces 122 of the conductive portions 12 are substantially coplanar. In some embodiments, at least one of the conductive portions 12 of the interconnection structure 10 includes a curved sidewall 123 connecting to the surface 121. In some embodiments, the patterned conductive layer of the interconnection structure 10 has a thickness T1. In some embodiments, the patterned conductive layer of the interconnection structure 10 may have a pattern density. In some embodiments, the term "pattern density" may refer to at least one of a line/space (L/S), a pitch, and an input/output (I/O) pin count, which will be discussed in details hereinafter. In some embodiments, a pitch of conductive elements (e.g., the conductive portions 12) of the patterned conductive layer of the interconnection structure 10 may be equal to or greater than about 200 μm. In some embodiments, a line/space (L/S) of the patterned conductive layer of the interconnection structure 10 may be about 75 μm/120 μm. In some embodiments, an input/output (I/O) pin count of the interconnection structure 10 within the electronic carrier 1 may be equal to or lower than about 100 depending on the size of the electronic carrier 1. In some embodiments, the interconnection structure 10 may include a substrate. In some embodiments, the patterned conductive layer of the interconnection structure 10 includes a leadframe. In some embodiments, the plurality of conductive portions 12 of the interconnection structure 10 includes a plurality of leads 12. In some embodiments, the interconnection structure 10 is made of or includes copper (Cu).

The interconnection structure 20 may include a patterned conductive layer different from the patterned conductive layer of the interconnection structure 10. In some embodiments, the patterned conductive layer of the interconnection structure 20 has a thickness T2. In some embodiments, the thickness T2 of the patterned conductive layer of the interconnection structure 20 may refers to the thickness of one layer (e.g., the thickness of the conductive layer 24) or the thickness of multiple layers in the patterned conductive layer. In some embodiments, the thickness T1 of the patterned conductive layer of the interconnection structure 10 is greater than the thickness T2 of the patterned conductive layer of the interconnection structure 20. In some embodiments, the patterned conductive layer of the interconnection structure 20 may have a pattern density higher than the pattern density of the patterned conductive layer of the interconnection structure 10. In some embodiments, a pitch of conductive elements (e.g., conductive layers/conductive vias/conductive pads) of the patterned conductive layer of the interconnection structure 20 may be equal to or greater than about 24 μm. In some embodiments, an L/S of the patterned conductive layer of the interconnection structure 20 may be about 12 μm/12 μm. In some embodiments, an I/O pin count of the interconnection structure 20 within the electronic carrier 1 may be equal to or lower than about 1000 depending on the size of the electronic carrier 1. In some embodiments, the interconnection structure 20 includes a substrate. In some embodiments, the interconnection structure 20 includes a coreless substrate. In some embodiments, the interconnection structure 20 includes an embedded trace substrate. In some embodiments, the interconnection structure 20 includes a molded interconnecting substrate (MIS).

In some embodiments, the interconnection structure 20 includes a dielectric layer 26, a trace layer 22, conductive layers 23 and 24, and at least one conductive via 28. In some embodiments, the interconnection structure 20 has at least one contact port (i.e., the conductive layers 24) at a side of the interconnection structure 10 and facing the interconnection structure 10. In some embodiments, the dielectric layer 26 has a surface 261 and a surface 262 opposite to the surface 261. In some embodiments, the dielectric layer 26 includes an encapsulant encapsulating the conductive layer 23, the trace layer 22, and the at least one conductive via 28. In some embodiments, the trace layer 22 is embedded in the dielectric layer 26 and exposed from the surface 261 of the dielectric layer 26. In some embodiments, the conductive layer 24 is on the surface 262 of the dielectric layer 26. In some embodiments, the at least one conductive via 28 has a substantially constant width. In some embodiments, the patterned conductive layer of the interconnection structure 20 includes the trace layer 22, the conductive layers 23 and 24, and the at least one conductive via 28. In some embodiments, the trace layer 22, the conductive layers 23 and 24, and the conductive via 28 may be made of or include a conductive material such as a metal or metal alloy. Examples include gold (Au), silver (Ag), aluminum (Al), copper (Cu), or an alloy thereof. In some embodiments, the dielectric layer 26 includes an epoxy resin having fillers, a molding compound (e.g., an epoxy molding compound or other molding compound), polyimide (PI), a phenolic compound or material, a material with a silicone dispersed therein, bismaleimide triazine (BT), polybenzoxazole (PBO), an Ajinomoto build-up film (ABF), Prepreg (PP), or a combination thereof.

In some embodiments, the interconnection structure 10 and the interconnection structure 20 are heterogeneous interconnection structures. In some embodiments, a pitch of the conductive elements of the patterned conductive layer of the interconnection structure 10 is different from a pitch of the conductive elements of the patterned conductive layer of the interconnection structure 20. In some embodiments, a ratio of a pitch of the conductive elements of the patterned conductive layer of the interconnection structure 10 to a pitch of the conductive elements of the patterned conductive layer of the interconnection structure 20 may be greater than about 2. In some embodiments, a ratio of a pitch of the conductive elements of the patterned conductive layer of the interconnection structure 10 to a pitch of the conductive elements of the patterned conductive layer of the interconnection structure 20 may be greater than about 5. In some embodiments, an L/S of the patterned conductive layer of the interconnection structure 10 is different from an L/S of the patterned conductive layer of the interconnection structure 20. In some embodiments, a ratio of an L/S of the patterned conductive layer of the interconnection structure 10 to an L/S of the patterned conductive layer of the interconnection structure 20 may be greater than about 2. In some embodiments, a ratio of an L/S of the patterned conductive layer of the interconnection structure 10 to an L/S of the patterned conductive layer of the interconnection structure 20 may be greater than about 5.

In some embodiments, a density of conductive terminals of the patterned conductive layer of the interconnection structure 10 is different from a density of conductive terminals of the patterned conductive layer of the interconnection structure 20. For example, an I/O pin count of the interconnection structure 10 within the electronic carrier 1 is different from an I/O pin count of the interconnection structure 20 within the electronic carrier 1. In some embodiments, a density of conductive terminals of the patterned conductive layer of the interconnection structure 20 is greater than a density of conductive terminals of the patterned conductive layer of the interconnection structure 10. In some embodiments, a ratio of an I/O pin count of the interconnection structure 20 within the electronic carrier 1 to an I/O pin count of the interconnection structure 10 within the electronic carrier 1 may be equal to or greater than about 5. In some embodiments, a ratio of an I/O pin count of the interconnection structure 20 within the electronic carrier 1 to an I/O pin count of the interconnection structure 10 within the electronic carrier 1 may be equal to or greater than about 10.

In some embodiments, a rigidity of the interconnection structure 10 is different from a rigidity of the interconnection structure 20. In some embodiments, a rigidity of the interconnection structure 10 is greater than a rigidity of the interconnection structure 20.

While the manufacturing cost of a leadframe is relatively low, a leadframe can only be formed as a single layer having a relatively low input/output (I/O) pin count. On the other hand, an embedded trace substrate may be relatively thin and provided with multiple layers having a relatively high I/O pin count; however, it is vulnerable to warpage since it is a coreless substrate and relatively flexible, and thus formation of a relatively thick supporting layer (e.g., a thick Cu layer) is usually required to solve the warpage issue. In some embodiments, the interconnection structure 10 may be a leadframe, and the interconnection structure 20 may be a coreless substrate, e.g., an embedded trace substrate including an embedded trace layer. Therefore, the interconnection structure 10 having a relatively high rigidity can provide sufficient support for the interconnection structure 20, and thus formation of a relatively thick supporting layer (e.g., a thick Cu layer) in the interconnection structure 20 can be omitted while the role thereof being replaced by the interconnection structure 10, such that the overall thickness of the electronic carrier 1 can be reduced, and the long cycle time as well as the cost for forming the relatively thick supporting layer can be omitted. In addition, the interconnection structure 10 can provide additional heat dissipation effects for the interconnection structure 20.

The interconnection structure 10 may be electrically coupled to the interconnection structure 20 through the non-soldering joint 40 between and outside of the interconnection structure 10 and the interconnection structure 20. The non-soldering joint 40 may bond the patterned conductive layer of the interconnection structure 10 to the patterned conductive layer of the interconnection structure 20. In some embodiments, the interconnection structure 10 is electrically connected to the interconnection structure 20 through the non-soldering joint 40. In some embodiments, the non-soldering joint 40 may be or include a material (also referred to as "a first material") electrically connecting the interconnection structure 10 to the interconnection structure 20. In some embodiments, the non-soldering joint 40 is disposed between the contact port (i.e., the conductive portion 12) of the interconnection structure 10 and the interconnection structure 20. In some embodiments, the non-soldering joint 40 is disposed between the contact port (i.e., the conductive portion 12) of the interconnection structure 10 and the contact port (i.e., the conductive layer 24) of the interconnection structure 20. In some embodiments, the non-soldering joint 40 is on the surfaces 121 of the conductive portions 12 of the patterned conductive layer of the interconnection structure 10. In some embodiments, the non-soldering joint 40 contacts the surfaces 121 of the conductive portions 12 of the patterned conductive layer of the interconnection structure 10. In some embodiments, the conductive portions 12 of the patterned conductive layer of the interconnection structure 10 contact the non-soldering joint 40 at a plurality of interfaces (e.g., the surfaces 121), and the interfaces are substantially coplanar. In some embodiments, the non-soldering joint 40 contacts the conductive layer 24 of the interconnection structure 20. In some embodiments, the non-soldering joint 40 includes a conductive paste. In some embodiments, the non-soldering joint 40 includes a curable resin and a conductive material in the curable resin. The conductive material may include copper, silver, or a combination thereof. In some embodiments, a curing temperature of the non-soldering joint 40 is from about 120° C. to about 150° C. In some embodiments, a curing temperature of the non-soldering joint 40 is from about 120° C. to about 130° C.

The dielectric structure 50 may be around the non-soldering joint 40. In some embodiments, the dielectric structure 50 surrounds the non-soldering joint 40. In some embodiments, the dielectric structure 50 may be or include a material (also referred to as "a second material") different from the material of the non-soldering joint 40. In some embodiments, the dielectric structure 50 contacts the non-soldering joint 40, the interconnection structure 10, and the interconnection structure 20. In some embodiments, the dielectric structure 50 includes an opening for accommodating the non-soldering joint 40, and the profile of the opening is defined by the non-soldering joint 40. In some embodiments, a thickness of the dielectric structure 50 is defined by the non-soldering joint 40. In some embodiments, the dielectric structure 50 may serve as a binder bonding the interconnection structure 10 and the interconnection structure 20. In some embodiments, the dielectric structure 50 encapsulates the conductive layer 24 on the surface 262 of the dielectric layer 26. In some embodiments, the dielectric structure 50 is conformal with the curved sidewall 123 and the surface 121 of at least one of the conductive portions 12 of the interconnection structure 10. In some embodiments, a curing temperature of the dielectric structure 50 is higher than a curing temperature of the non-soldering joint 40. In some embodiments, a curing temperature of the dielectric structure 50 is higher than a curing temperature of the non-soldering joint 40 by about 10° C. or more than 10° C. In some embodiments, a curing temperature of the dielectric structure 50 is higher than a curing temperature of the non-soldering joint 40 by about 50° C. In some embodiments, a curing temperature of the dielectric structure 50 is higher than a curing temperature of the non-soldering joint 40 by about 100° C. In some embodiments, a curing temperature of the dielectric structure 50 is higher than about 160° C. In some embodiments, a curing temperature of the dielectric structure 50 is from about 180° C. to about 230° C.

In some embodiments, the dielectric structure 50 may include a resin (e.g., an epoxy resin), ink (e.g. Ajinomoto build-up film (ABF) ink), a molding compound (e.g., an epoxy molding compound or other molding compound), prepreg (PP), polyimide (PI), a phenolic compound or material, or a combination thereof. In some embodiments, the dielectric structure 50 includes a resin and a plurality of reinforcing fibers dispersed in the resin. In some embodiments, the dielectric structure 50 includes a resin and a network of fibers fixed within the resin. In some embodiments, the dielectric structure 50 includes prepreg (PP) layer and glass fibers dispersed within the prepreg (PP) layer. While particles (e.g., fillers) in a resin may tend to flow around when the resin is in a flowable state, e.g., in a curing operation, the particles may accumulate adjacent to a bonding interface between the resin and another layer/structure so as to affect the bonding strength, thus delamination may occur, and reliability may decrease. According to some embodiments of the present disclosure, fibers in the resin of the dielectric structure 50 are less movable or flowable when the resin is in a flowable state, such that the fibers can stay dispersed within the resin of the dielectric structure 50 without undesirably accumulated in local regions, thus the supporting ability and the rigidity of the dielectric structure 50 can be reinforced by the fibers, and the bonding strength between the dielectric structure 50 and the interconnection structures 10 and 20 can be satisfactory.

The electronic component 60 may be electrically connected to the interconnection structure 20 through the conductive bumps 64. In some embodiments, the conductive bumps 64 contact the embedded trace layer 22 exposed from the interconnection structure 20. In some embodiments, the encapsulant 62 encapsulates the electronic component 60, the conductive bumps 64, the surface 261 of the dielectric layer 26, and portions of the exposed surface of the embedded trace layer 22.

The conductive pads 70 are on the surfaces 122 of the conductive portions 12 of the patterned conductive layer of the interconnection structure 10. In some embodiments, the surfaces 122 of the conductive portions 12 of the patterned conductive layer of the interconnection structure 10 are substantially coplanar. In some embodiments, the solder mask 72 is disposed on the dielectric structure 50 and between the conductive portions 12 of the patterned conductive layer of the interconnection structure 10.

In some embodiments, the non-soldering joint 40 is cured earlier than the dielectric structure 50 in the manufacturing process, and thus the distance between the interconnection structure 10 and the interconnection structure 20 can be defined and fixed by the cured non-soldering joint 40. After the distance between the interconnection structure 10 and the interconnection structure 20 is defined and fixed, the dielectric structure 50 is then cured so as to assist the bonding (or adhesion) between the interconnection structure 10 and the interconnection structure 20. In addition, in some embodiments, since the dielectric structure 50 is cured after the non-soldering joint 40, the dielectric structure 50 can contact the non-soldering joint 40 when it is still flowable (e.g. at B-stage) and then be conformal with the profile (e.g., the profile of an external lateral surface) of the cured non-soldering joint 40 after the dielectric structure 50 is cured. Moreover, the dielectric structure 50 is flowable and has a relatively loose structure in the curing process of the non-soldering joint 40, and thus the dielectric structure 50 can provide outgassing paths for the non-soldering joint 40 as it is in the curing process. Therefore, voids that may possibly be generated during the curing process of the non-soldering joint 40 can be effectively released outwards, and thus the cured non-soldering joint 40 can be substantially free of voids, which can significantly increase the structural strength as well as the conductivity of the non-soldering joint 40.

Figure 1B:
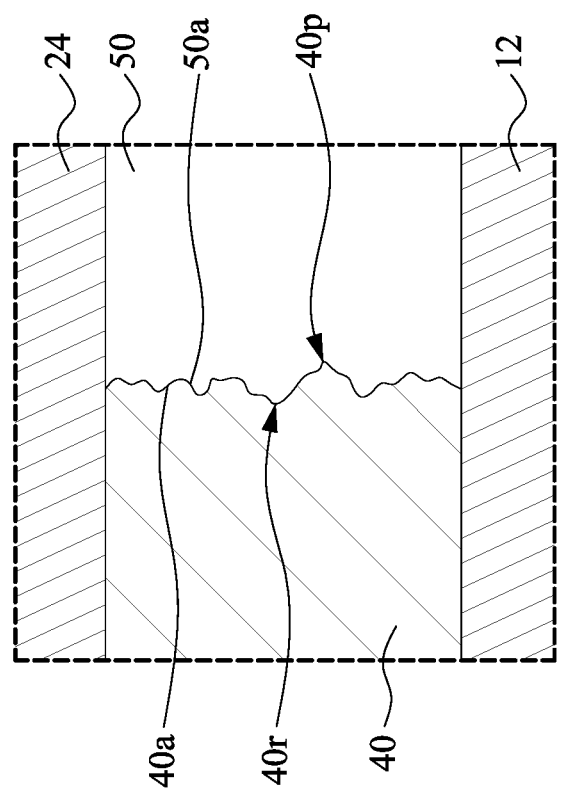
FIG. 1B illustrates a cross-sectional view of a portion of an electronic carrier in accordance with some embodiments of the present disclosure.

FIG. 1B illustrates a cross-sectional view of a portion of an electronic carrier 1 in accordance with some embodiments of the present disclosure. In some embodiments, FIG. 1B illustrates the structure of the portion 1B shown in FIG. 1.

In some embodiments, since the non-soldering joint 40 is formed from subjecting to pressures from the interconnections structures 10 and 20 during a bonding operation and a curing operation of the flowable material of the non-soldering joint 40, the cured non-soldering joint 40 may have an irregular (or coarse) surface structure. In some embodiments, the interface between the non-soldering joint 40 and the dielectric structure 50 includes an irregular shape. According to some embodiments of the present disclosure, such coarse or irregular surface structure of the non-soldering joint 40 is advantageous to increasing the adhesion between the non-soldering joint 40 and the dielectric structure 50.

In some embodiments, an external surface 50a of the dielectric structure 50 is conformal with an external surface 40a (e.g., a lateral surface) of the non-soldering joint 40. In some embodiments, the external surface 40a of the non-soldering joint 40 includes at least one protruded portion 40p and at least one recessed portion 40r. In some embodiments, with the irregular interface between the dielectric structure 50 and the non-soldering joint 40, the non-soldering joint 40 is interlocked with the dielectric structure 50.

According to some embodiments of the present disclosure, heterogeneous interconnection structures including patterned conductive layers serving different functions can be bonded to each other so as to form an integrated electronic carrier including the various functions of each of the interconnection structures included, e.g., the pitch, the line/space (L/S), the input/output (I/O) pin count, the rigidity, and the structural details. Therefore, various functions of heterogeneous interconnection structures can be integrated in one electronic carrier, and the overall size of the electronic carrier can be reduced. Furthermore, the interconnection structures may be manufactured separately prior to bonding, such that known-good interconnection structures may be selected and then provided for bonding instead of discarding or reworking the entire package including bonded interconnection structures when one or some of the interconnection structures in the package being inspected failed or malfunctioned, thus the yields can be increased, and the costs can be reduced.

In addition, according to some embodiments of the present disclosure, heterogeneous interconnection structures are bonded through a non-soldering joint, such that the bonding/assembling process is relatively simplified compared to bonding by, for example, solder joint technique. Moreover, the non-soldering joint can remain in solid state permanently after being cured while solders may melt and become flowable upon high temperature treatments; therefore, the heterogeneous interconnection structures bonded through a non-soldering joint can form a relatively stable and reliable bonded structure despite that further thermal treatments may be performed on the bonded structure in subsequent manufacturing processes. In addition, formation of intermetallic compounds (IMC) between solders and metal can be prevented by bonding the interconnection structures through the non-soldering joint, and thus the electrically connection between the interconnection structures can remain satisfactory without being affected by the IMC.

Furthermore, according to some embodiments of the present disclosure, heterogeneous interconnection structures are bonded through a non-soldering joint with a dielectric structure (or a binder) around the non-soldering joint instead of conductive vias, solders, or conductive bumps, and thus the dielectric structure (or the binder) can enhance the bonding strength of the non-soldering joint while still keeping the manufacturing process relatively simplified. Moreover, according to some embodiments of the present disclosure, the dielectric structure (or the binder) has a relatively high curing temperature and thus has a relatively high weathering resistance, which is particularly advantageous to automobile applications.

In addition, compared to conventional interposers having plated conductive layer/pads constructing the bonding surface, the bonding surface may be uneven or non-coplanar and thus unfavorable to bonding to interconnection structures. In contrast, according to some embodiments of the present disclosure, the interconnection structure 10 including conductive portions 12 have substantially coplanar surfaces facing the non-soldering joint (e.g., leads of a leadframe have substantially coplanar surfaces), such that the bonding surface can be substantially planar which benefits the bonding between the interconnection structure 10 and the interconnection structure 20, and thus the bonding strength of the electronic carrier 1 can be increased. Moreover, according to some embodiments of the present disclosure, the interconnection structure 10 including conductive portions 12 have substantially coplanar surfaces facing away from the non-soldering joint, which is advantageous to the formation of conductive pads (e.g., conductive pads 70) serving external electrical connections.

Figure 2:
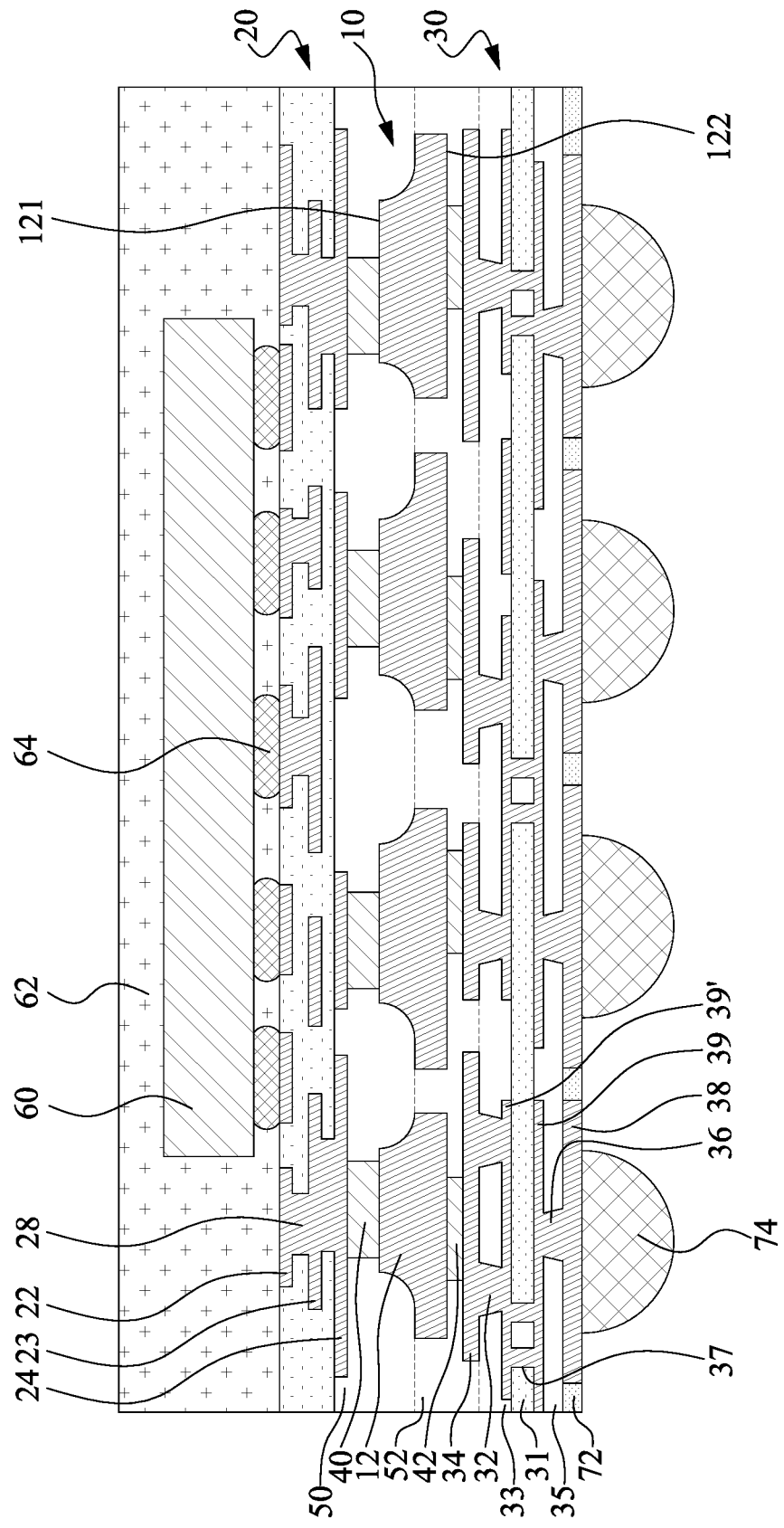
FIG. 2 illustrates a cross-sectional view of an electronic carrier in accordance with some embodiments of the present disclosure.

FIG. 2 illustrates a cross-sectional view of an electronic carrier 2 in accordance with some embodiments of the present disclosure. The electronic carrier 2 is similar to the electronic carrier 1 in FIG. 1, and the differences therebetween are described as follows.

The electronic carrier 2 may further include an interconnection structure 30, a non-soldering joint 42, a dielectric structure 52, and electrical contacts 74.

The interconnection structure 30 may be electrically connected to the interconnection structure 10. The interconnection structure 30 may include a patterned conductive layer different from the patterned conductive layer of the interconnection structure 10 and the patterned conductive layer of the interconnection structure 20. In some embodiments, the thickness T1 of the patterned conductive layer of the interconnection structure 10 is greater than a thickness of the patterned conductive layer of the interconnection structure 30. In some embodiments, the thickness of the patterned conductive layer of the interconnection structure 30 may refers to the thickness of one layer or the thickness of multiple layers in the patterned conductive layer. In some embodiments, the patterned conductive layer of the interconnection structure 30 may have a pattern density higher than the pattern density of the patterned conductive layer of the interconnection structure 10. In some embodiments, the patterned conductive layer of the interconnection structure 30 may have a pattern density higher than the pattern density of the patterned conductive layer of the interconnection structure 20. In some embodiments, a pitch of conductive elements (e.g., conductive layers/conductive vias/conductive pads) of the patterned conductive layer of the interconnection structure 30 may be equal to or greater than about 10 μm. In some embodiments, an L/S of the patterned conductive layer of the interconnection structure 30 may be about 5 μm/5 μm. In some embodiments, an I/O pin count of the interconnection structure 30 within the electronic carrier 2 may be equal to or higher than about 1000 depending on the size of the electronic carrier 2. In some embodiments, the interconnection structure 30 includes a substrate. In some embodiments, the interconnection structure 30 includes a core substrate. In some embodiments, the interconnection structure 30 includes a build-up substrate.

In some embodiments, the interconnection structure 30 includes a core 31, dielectric layers 33 and 35 on opposite surfaces of the core 31, at least one interconnection via 37 passing through the core 31, at least one conductive via 32 passing through the dielectric layer 33, at least one conductive via 36 passing through the dielectric layer 35, conductive layers 34 and 39' connected to the conductive via 32, and conductive layers 38 and 39 connected to the conductive via 36. In some embodiments, the interconnection structure 30 has at least one contact port (i.e., the conductive layers 34) at a side of the interconnection structure 30 and facing the interconnection structure 10. In some embodiments, the conductive via 32 has a tapered cross-sectional shape. In some embodiments, the conductive via 36 has a tapered cross-sectional shape. In some embodiments, the conductive layers 34, 38, 39 and 39', the conductive vias 32 and 36, and the interconnection via 37 may be made of or include a conductive material such as a metal or metal alloy. Examples include gold (Au), silver (Ag), aluminum (Al), copper (Cu), or an alloy thereof. In some embodiments, the dielectric layers 33 and 35 may include dielectric laminates, including a bismaleimide triazine (BT) laminate, an ABF laminate, or the like. The dielectric laminate may include fillers.

In some embodiments, the interconnection structures 10 and 30 are heterogeneous interconnection structures. In some embodiments, the interconnection structures 10, 20, and 30 are heterogeneous interconnection structures. In some embodiments, a pitch of the conductive elements of the patterned conductive layer of the interconnection structure 30 is different from a pitch of the conductive elements of the patterned conductive layer of the interconnection structure 10 and/or 20. In some embodiments, a ratio of a pitch of the conductive elements of the patterned conductive layer of the interconnection structure 10 to a pitch of the conductive elements of the patterned conductive layer of the interconnection structure 30 may be greater than about 5. In some embodiments, a ratio of a pitch of the conductive elements of the patterned conductive layer of the interconnection structure 10 to a pitch of the conductive elements of the patterned conductive layer of the interconnection structure 30 may be equal to or greater than about 20. In some embodiments, an L/S of the patterned conductive layer of the interconnection structure 30 is different from an L/S of the patterned conductive layer of the interconnection structure 10 and/or 20. In some embodiments, a ratio of an L/S of the patterned conductive layer of the interconnection structure 10 to an L/S of the patterned conductive layer of the interconnection structure 30 may be greater than about 5. In some embodiments, a ratio of an L/S of the patterned conductive layer of the interconnection structure 10 to an L/S of the patterned conductive layer of the interconnection structure 30 may be equal to or greater than about 15.

In some embodiments, a density of conductive terminals of the patterned conductive layer of the interconnection structure 30 is different from a density of conductive terminals of the patterned conductive layer of the interconnection structure 10 and/or 20. For example, an I/O pin count of the interconnection structure 30 within the electronic carrier 2 is different from an I/O pin count of the interconnection structure 10 and/or 20 within the electronic carrier 2. In some embodiments, a ratio of a density of conductive terminals of the patterned conductive layer of the interconnection structure 30 to a density of conductive terminals of the patterned conductive layer of the interconnection structure 10 is greater than about 5. In some embodiments, a ratio of an I/O pin count of the interconnection structure 30 within the electronic carrier 2 to an I/O pin count of the interconnection structure 10 within the electronic carrier 2 may be equal to or greater than about 5. In some embodiments, a ratio of an I/O pin count of the interconnection structure 30 within the electronic carrier 2 to an I/O pin count of the interconnection structure 10 within the electronic carrier 2 may be equal to or greater than about 10.

In some embodiments, a rigidity of the interconnection structure 30 is different from a rigidity of the interconnection structure 10 and/or 20. In some embodiments, a rigidity of the interconnection structure 10 is greater than a rigidity of the interconnection structure 30. In some embodiments, a rigidity of the interconnection structure 30 is greater than a rigidity of the interconnection structure 20.

While manufacturing a build-up substrate having a relatively high I/O pin count requires less time than that of an embedded trace substrate because a build-up substrate can be formed by building up two layers at a time on two opposite sides, the core layer providing an enhanced rigidity for the build-up substrate inevitably increases the thickness of the build-up substrate. In addition, a build-up substrate is readily flip-chip bonded to another interconnection structure/component by solder joint technique; however, the solder mask is prone to absorbing moisture, and moisture trapped within a package may cause warpage and/or delamination. In some embodiments, the interconnection structure 10 may be a leadframe, the interconnection structure 20 may be a coreless substrate, e.g., an embedded trace substrate including an embedded trace layer, and the interconnection structure 30 may be a build-up substrate. Therefore, the interconnection structure 30 is bonded to the interconnection structure 10 through the non-soldering joint 40, such that a solder mask can be omitted inside the electronic carrier 2 between the interconnection structure 10 and the interconnection structure 30, and thus moisture absorbed within the electronic carrier 2 can be avoided, which significantly increases the stability and reliability of the electronic carrier 2. In addition, the interconnection structure 20 may be connected to the interconnection structure 30 serving to flip-chip bond to the electronic component 60 through an embedded trace layer, thus the required high I/O pin count can be satisfied, and the aforesaid issues raised from the solder mask can be effectively prevented.

The interconnection structure 10 may be electrically coupled to the interconnection structure 30 through the non-soldering joint 42 between and outside of the interconnection structure 10 and the interconnection structure 30. The non-soldering joint 42 may bond the patterned conductive layer of the interconnection structure 10 to the patterned conductive layer of the interconnection structure 30. In some embodiments, the interconnection structure 10 is electrically connected to the interconnection structure 30 through the non-soldering joint 42. In some embodiments, the non-soldering joint 42 is disposed between the contact port (i.e., the conductive portion 12) of the interconnection structure 10 and the contact port (i.e., the conductive layer 34) of the interconnection structure 30. In some embodiments, the non-soldering joint 42 may be or include a material (also referred to as "a first material") electrically connecting the interconnection structure 10 to the interconnection structure 30. In some embodiments, the non-soldering joint 42 is on the surfaces 122 of the conductive portions 12 of the patterned conductive layer of the interconnection structure 10. In some embodiments, the non-soldering joint 42 contacts the surfaces 122 of the conductive portions 12 of the patterned conductive layer of the interconnection structure 10. In some embodiments, the conductive portions 12 of the patterned conductive layer of the interconnection structure 10 contact the non-soldering joint 42 at a plurality of interfaces (e.g., the surfaces 122), and the interfaces are substantially coplanar. In some embodiments, the non-soldering joint 42 includes or is made of a material similar to that of the non-soldering joint 40, and the description thereof is omitted hereinafter.

The dielectric structure 52 may be around the non-soldering joint 42. In some embodiments, the dielectric structure 52 surrounds the non-soldering joint 42. In some embodiments, the dielectric structure 52 may be or include a material (also referred to as "a second material") different from the material of the non-soldering joint 42. In some embodiments, the dielectric structure 52 contacts the non-soldering joint 42, the interconnection structure 10, and the interconnection structure 30. In some embodiments, the dielectric structure 52 may serve as a binder bonding the interconnection structure 10 and the interconnection structure 30. In some embodiments, the dielectric structure 52 encapsulates the conductive layer 34 of the patterned conductive layer of the interconnection structure 30. In some embodiments, the dielectric structure 52 contacts the dielectric structure 50. In some embodiments, a curing temperature of the dielectric structure 52 is higher than a curing temperature of the non-soldering joint 42. In some embodiments, a curing temperature of the dielectric structure 52 is higher than a curing temperature of the non-soldering joint 40. In some embodiments, the dielectric structure 52 includes or is made of a material similar to that of the dielectric structure 50, and the description thereof is omitted hereinafter.

Figure 3A:
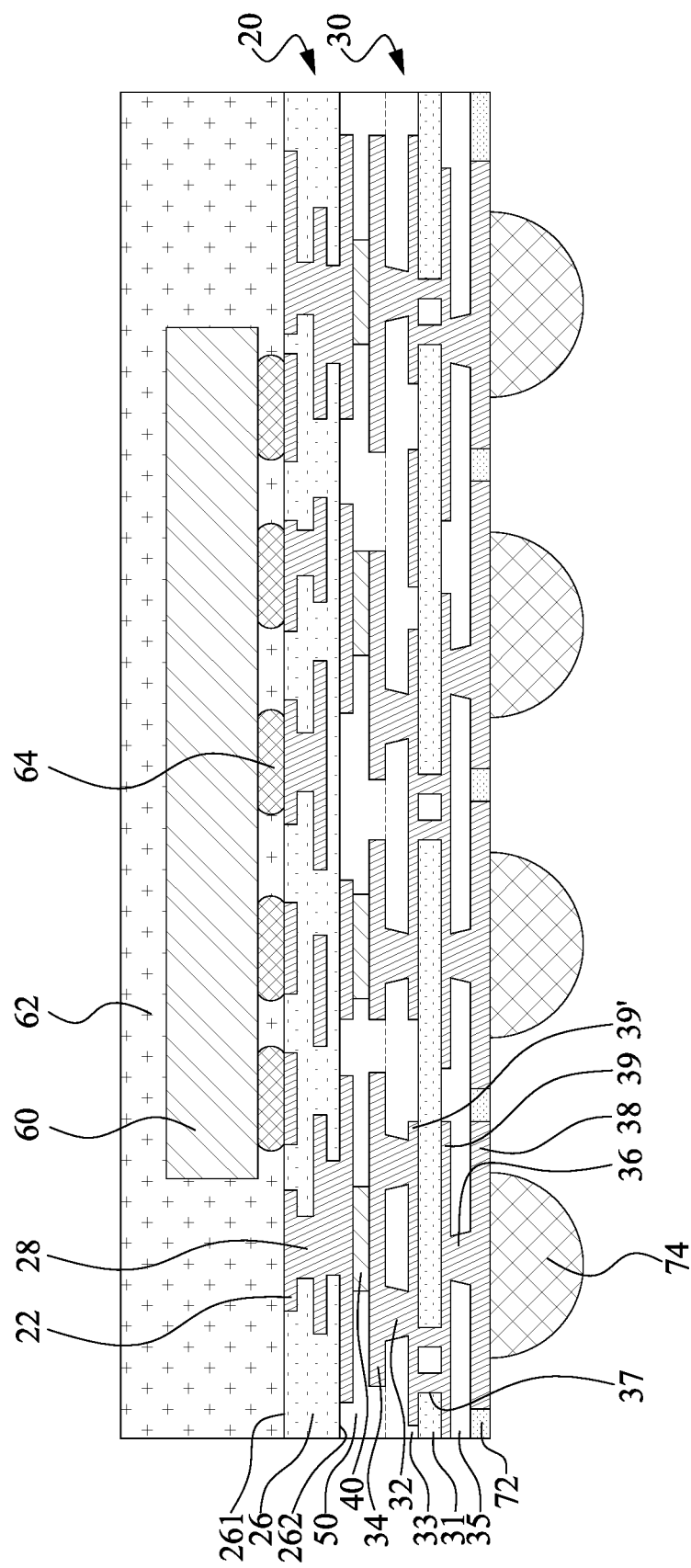
FIG. 3A illustrates a cross-sectional view of an electronic carrier in accordance with some embodiments of the present disclosure.

FIG. 3A illustrates a cross-sectional view of an electronic carrier 3A in accordance with some embodiments of the present disclosure. The electronic carrier 3A is similar to the electronic carrier 1 in FIG. 1, and the differences therebetween are described as follows.

In some embodiments, the interconnection structure 30 includes a build-up substrate 30, and the second interconnection structure comprises an embedded trace substrate including an embedded trace layer 22, and the non-soldering joint 40 contacts the interconnection structure 20 and the interconnection structure 30.

Figure 3B:
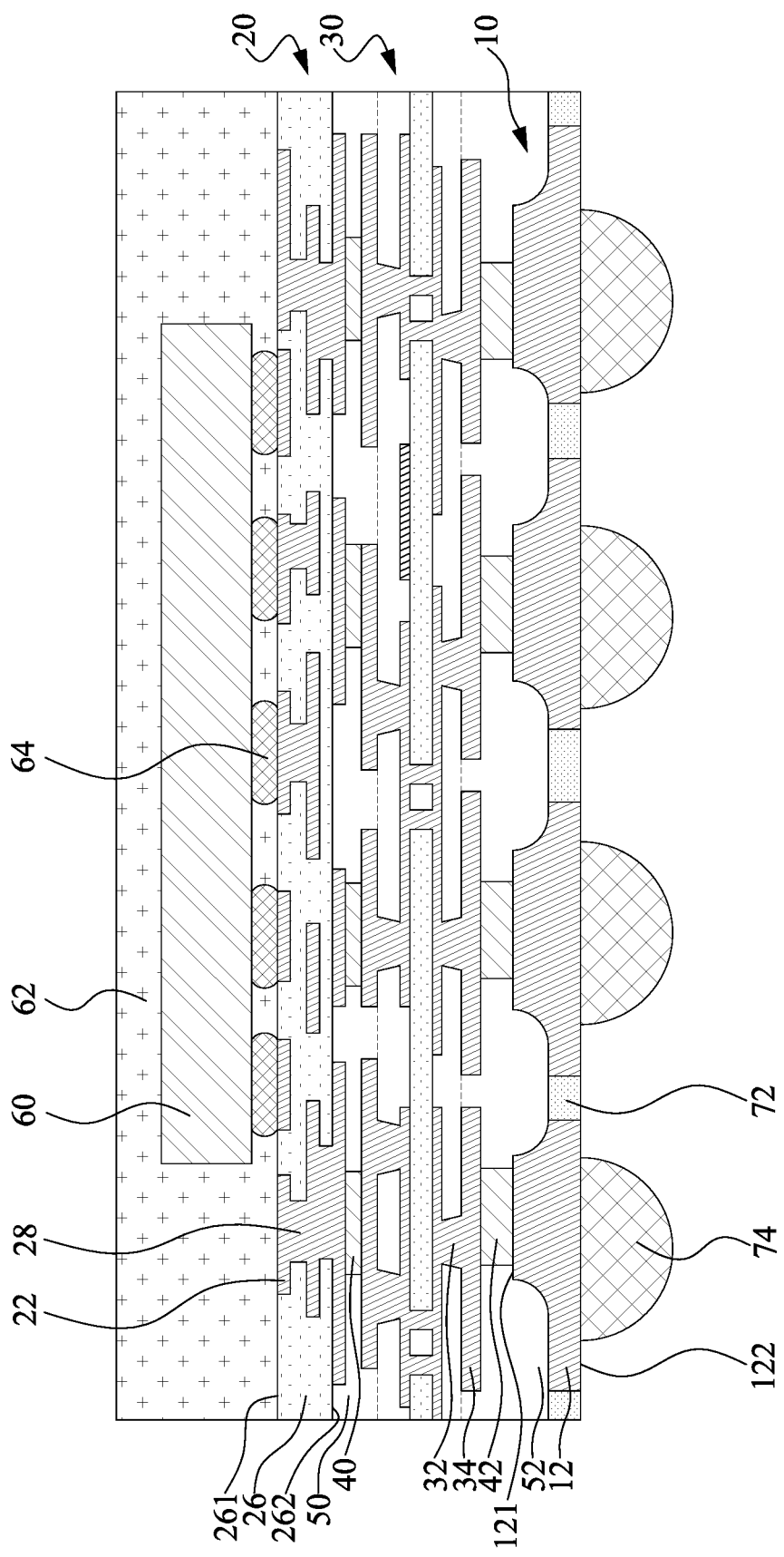
FIG. 3B illustrates a cross-sectional view of an electronic carrier in accordance with some embodiments of the present disclosure.

FIG. 3B illustrates a cross-sectional view of an electronic carrier 3B in accordance with some embodiments of the present disclosure. The electronic carrier 3B is similar to the electronic carrier 3A in FIG. 3A, and the differences therebetween are described as follows.

The electronic carrier 3B may further include an interconnection structure 10, a non-soldering joint 42, a dielectric structure 52, and electrical contacts 74. The interconnection structure 10 may be electrically connected to the interconnection structure 30.

In some embodiments, the non-soldering joint 42 bonds the interconnection structure 10 to the interconnection structure 30. In some embodiments, the non-soldering joint 42 contacts a conductive layer 34 of the interconnection structure 30. In some embodiments, the electrical contacts 74 are on the surfaces 122 of the conductive portions 12 of the interconnection structure 10. In some embodiments, the surfaces 122 of the conductive portions 12 of the interconnection structure 10 are substantially coplanar.

Figure 4:
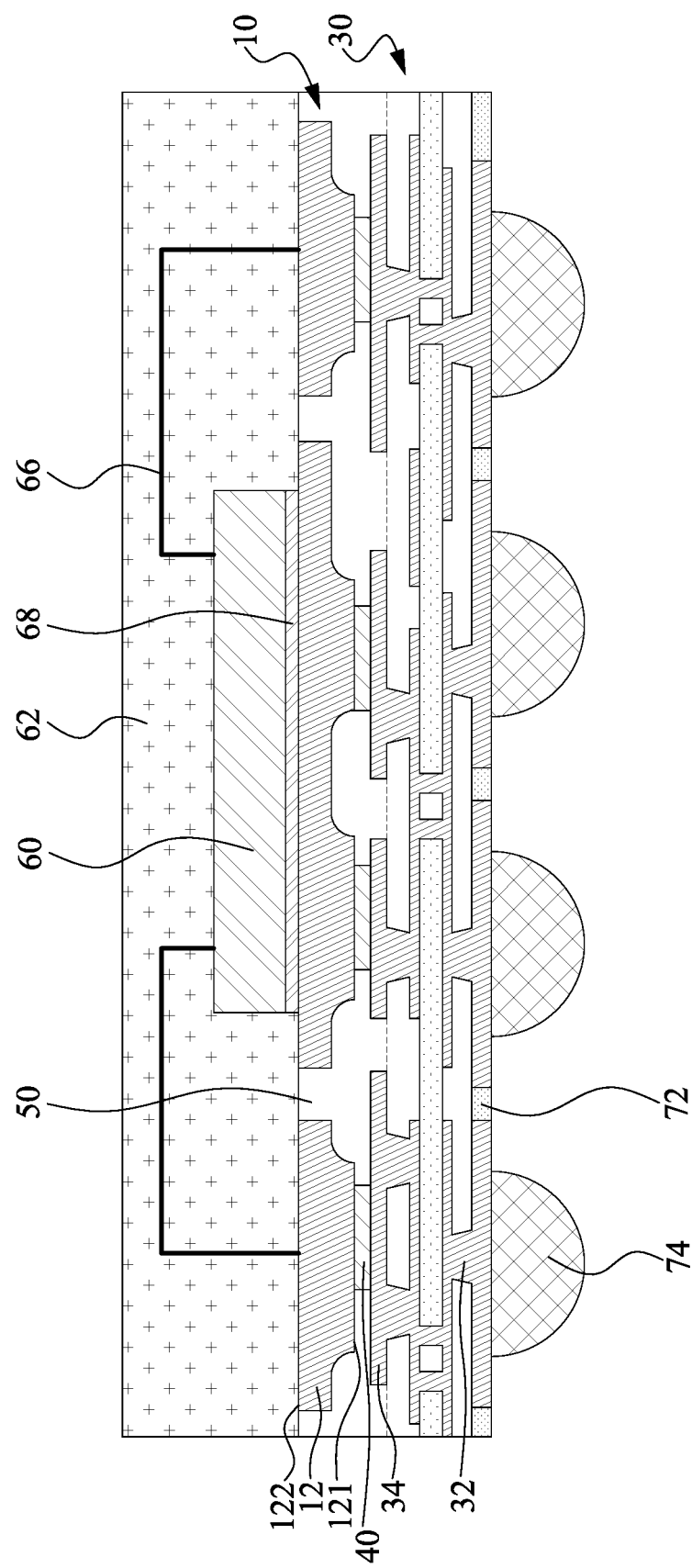
FIG. 4 illustrates a cross-sectional view of an electronic carrier in accordance with some embodiments of the present disclosure.

FIG. 4 illustrates a cross-sectional view of an electronic carrier 4 in accordance with some embodiments of the present disclosure. The electronic carrier 4 is similar to the electronic carrier 1 in FIG. 1, and the differences therebetween are described as follows.

The electronic carrier 4 may further include a bonding wire 66 and an adhesive layer 68. In some embodiments, the non-soldering joint 40 bonds the interconnection structure 10 to the interconnection structure 30. In some embodiments, the electronic component 60 is adhered to the interconnection structure 10 through the adhesive layer 68. In some embodiments, the electronic component 60 is disposed over the surface 122 of one of the conductive portions 12 of the interconnection structure 10, and the surfaces 122 of the conductive portions 12 of the interconnection structure 10 are substantially coplanar. In some embodiments, the electronic component 60 is electrically connected to the interconnection structure 10 through the bonding wire 66. In some embodiments, the bonding wire 66 electrically connects the electronic component 60 to the surface 122 of the conductive portion 12 of the interconnection structure 10.

FIG. 5A1, FIG. 5A, FIG. 5B, FIG. 5C, FIG. 5D, FIG. 5E, and FIG. 5F illustrate various operations in a method of manufacturing an electronic carrier 1 in accordance with some embodiments of the present disclosure.

Figure 5A:
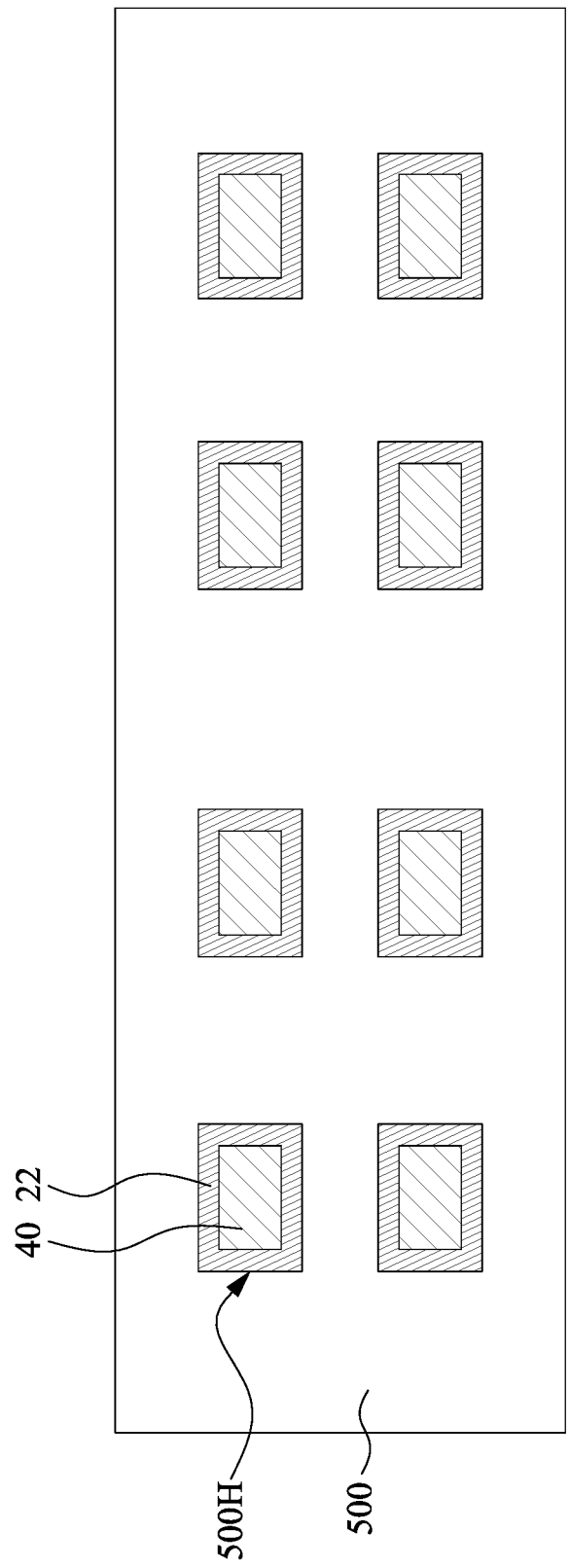
Figure 5A:
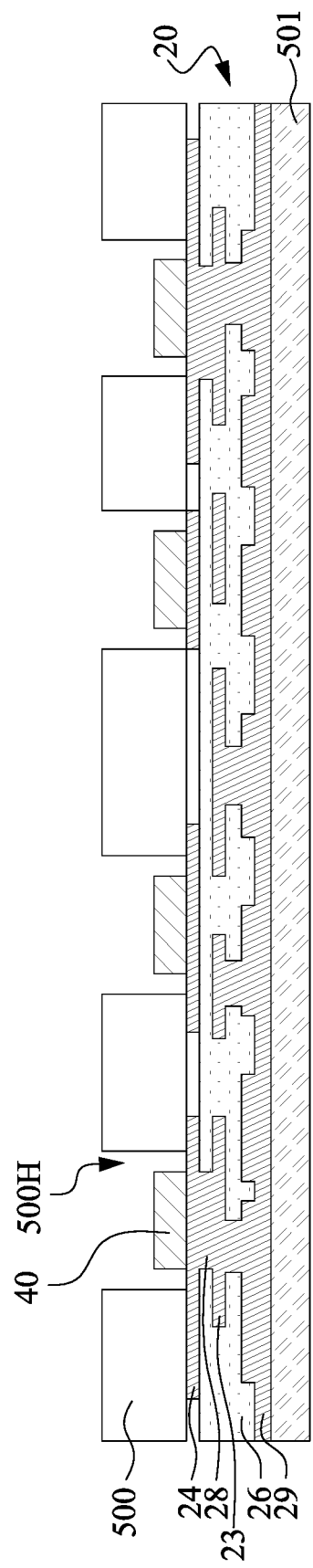

Referring to FIG. 5A, an interconnection structure 20 which includes an patterned conductive layer may be provided, a non-soldering joint 40 may be disposed on the interconnection structure 20, and a dielectric material layer (also referred to as "a binder material layer") 500 may be disposed around the non-soldering joint 40. In some embodiments, the interconnection structure 20 is disposed on a carrier 501. In some embodiments, the interconnection structure 20 includes a dielectric layer 26, conductive layers 23, 24 and 29, and at least one conductive via 28. In some embodiments, the dielectric material layer 500 is in the B stage when being disposed on the interconnection structure 20.

Referring to FIG. 5A1, which illustrates a top view of the structure illustrated in FIG. 5A, in some embodiments, the dielectric material layer 500 defines at least one opening 500H exposing a portion of the interconnection structure 20. In some embodiments, the non-soldering joint 40 is disposed on the portion of the interconnection structure 20 exposed from the dielectric material layer 500. In some embodiments, the non-soldering joint 40 is disposed within the opening 500H of the dielectric material layer 500. In some embodiments, the non-soldering joint 40 include a plurality of paste portions, and the paste portions are disposed within the openings 500H of the dielectric material layer 500.

Figure 5B:
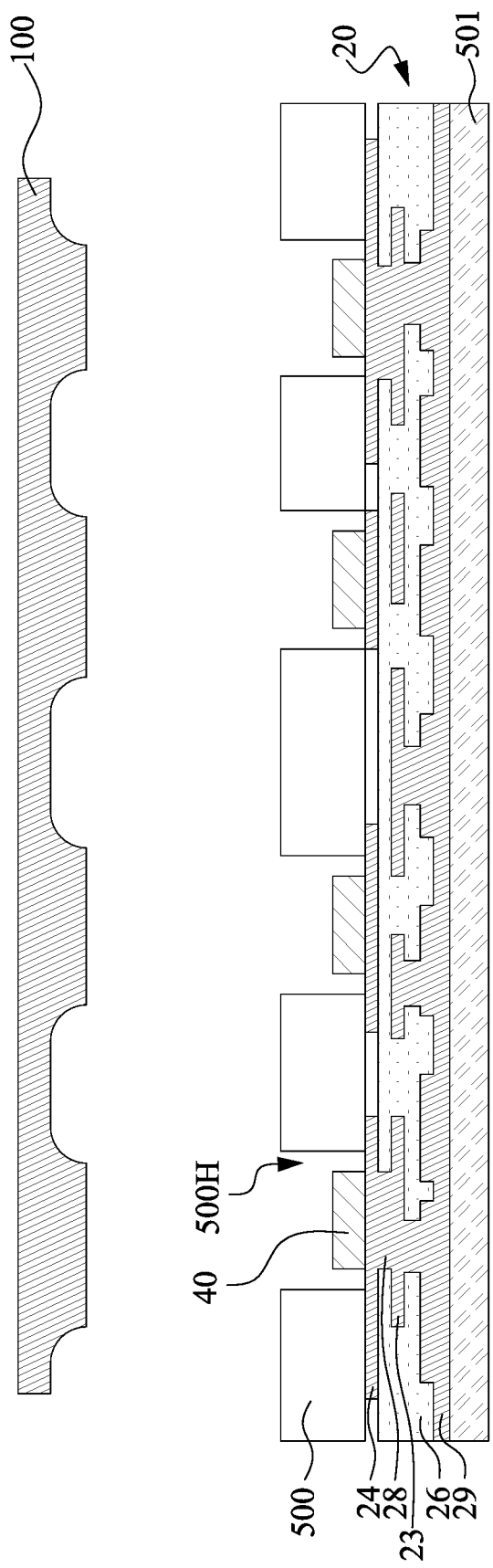

Referring to FIG. 5B, an interconnection structure 100 including an patterned conductive layer different from the patterned conductive layer of the interconnection structure 20 may be provided. In some embodiments, the interconnection structure 100 includes a leadframe.

Figure 5C:
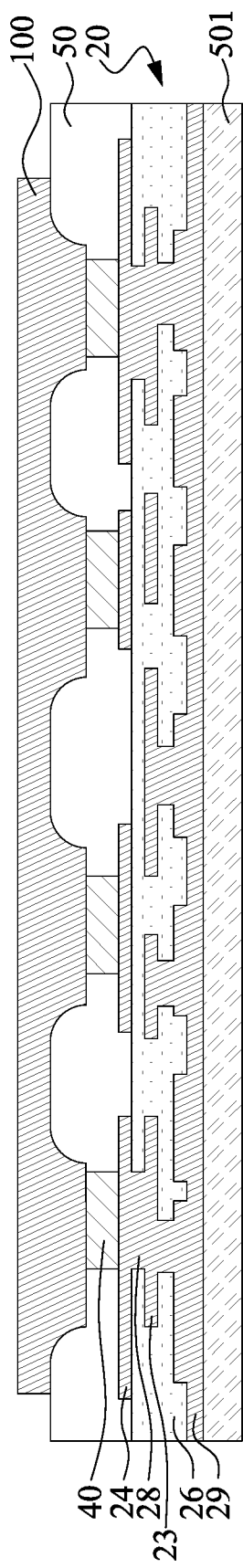

Referring to FIG. 5C, the interconnection structure 100 may be disposed on the non-soldering joint 40 to bond the interconnection structure 100 to the interconnection structure 20, and a curing operation may be performed on the non-soldering joint 40 and on the dielectric material layer 500 to form a dielectric structure (also referred to as "a binder") 50 between the interconnection structure 100 and the interconnection structure 20. In some embodiments, during the curing operation, the non-soldering joint 40 is cured before the dielectric material layer 500 is cured. In some embodiments, after the curing operation is completed, the B stage dielectric material layer 500 turns into the fully cured C stage dielectric structure 50. In some embodiments, the non-soldering joint 40 is cured earlier than the dielectric structure 50 in the curing operation. In some embodiments, the interconnection structure 100 may be laminated onto the non-soldering joint 40. In some embodiments, a curing temperature of the dielectric material layer 500 is higher than a curing temperature of the non-soldering joint 40. In some embodiments, performing the curing operation on the dielectric material layer 500 includes heating the dielectric material layer 500 under a temperature higher than a curing temperature of the non-soldering joint 40. In some embodiments, the temperature for curing the dielectric material layer 500 is higher than a curing temperature of the non-soldering joint 40 by about 10° C., 50° C., or 100° C. the In some embodiments, the temperature for curing the dielectric material layer 500 is from about 180° C. to about 230° C. In some embodiments, the dielectric material layer 500 includes a resin and a plurality of reinforcing fibers dispersed in the resin.

In some cases where the curing temperature of the dielectric material layer 500 is lower than the curing temperature of the non-soldering joint 40, the as-formed dielectric structure 50 may become fragile or even deteriorate when it is under the relatively high temperature for curing the non-soldering joint 40. In contrast, according to some embodiments of the present disclosure, the curing temperature of the dielectric material layer 500 is higher than the curing temperature of the non-soldering joint 40, and thus the as-formed dielectric structure 50 can be prevented from being damaged by the curing operation for the non-soldering joint 40. In addition, the dielectric material layer 500 and the non-soldering joint 40 can be cured in the same operation for curing the dielectric material layer 500, so as to simplify the processes.

In some embodiments, the dielectric material layer 500 may turn flowable during the curing operation. In some embodiments, the dielectric material layer 500 may turn flowable upon heating. Thus, the flowable dielectric material layer 500 may fill the voids/gaps between the interconnection structure 100 and the interconnection structure 20 and contact the non-soldering joint 40. In some embodiments, the non-soldering joint 40 and the dielectric material layer 500 are cured in the same operation.

Figure 5D:
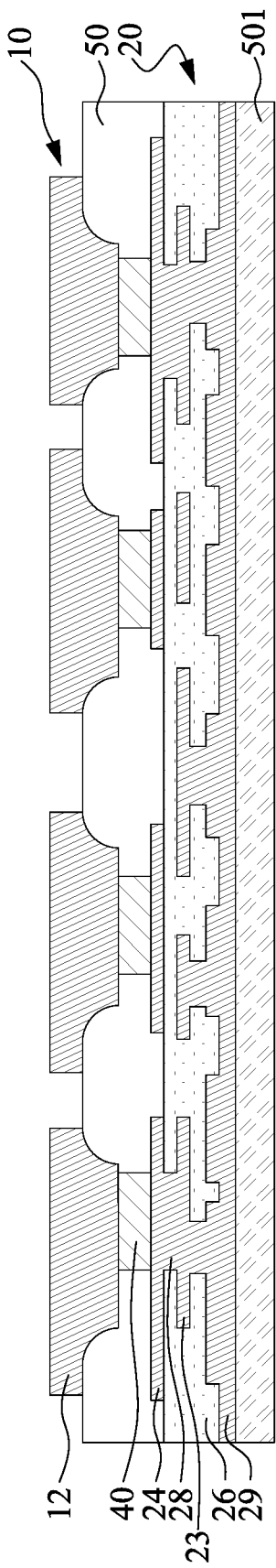

Referring to FIG. 5D, portions of the interconnection structure 100 may be removed to form a plurality of conductive portions 12, so as to form an interconnection structure 10 including a patterned conductive layer including the conductive portions 12. In some embodiments, the portions of the interconnection structure 100 may be removed by etching. In some embodiments, the patterned conductive layer including the conductive portions 12 may include a leadframe including a plurality of leads.

Figure 5E:
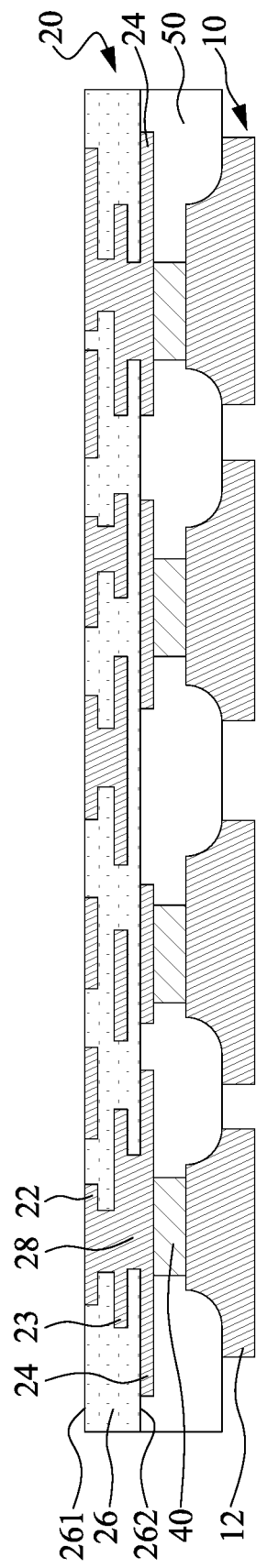

Referring to FIG. 5E, the carrier 501 may be removed, and a portion of the conductive layer 29 may be removed to form a trace layer 22 embedded in the dielectric layer 26 and exposed from a surface 261 of the dielectric layer 26.

Figure 5F:
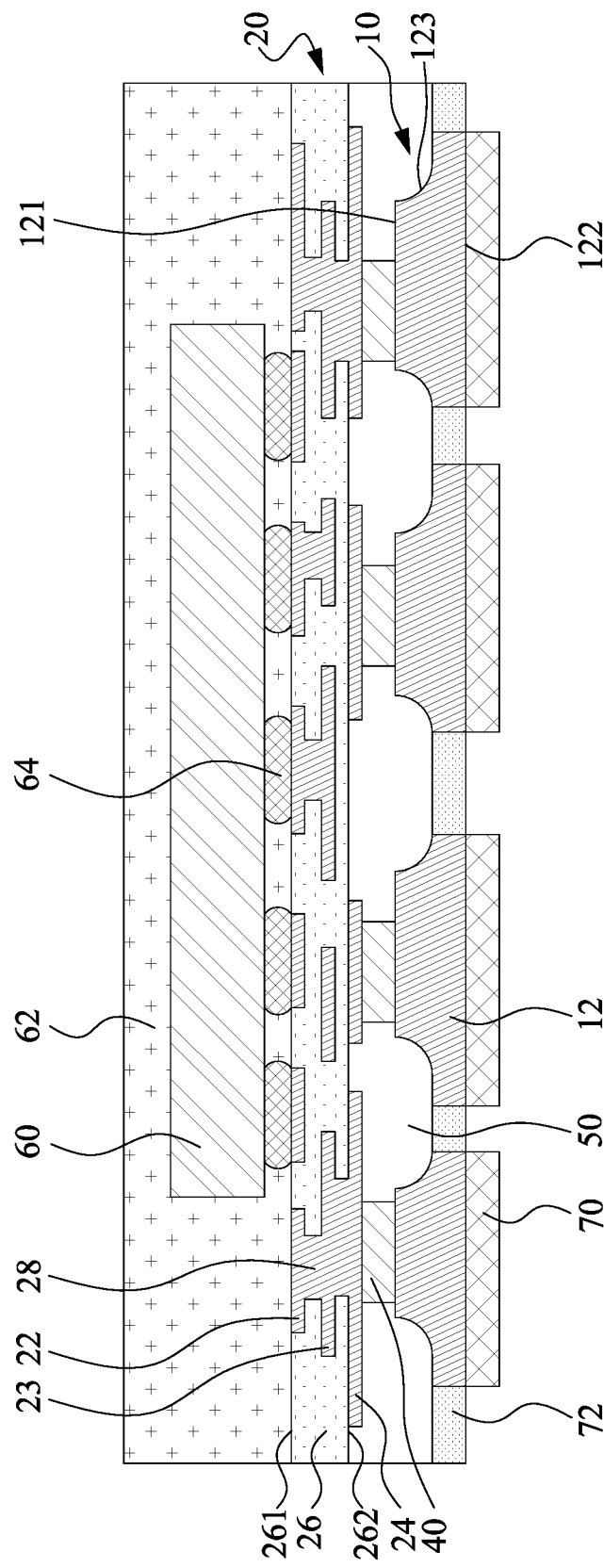

Referring to FIG. 5F, an electronic component 60 may be connected to the interconnection structure 20 through conductive bumps 64, and the electronic component 60, the conductive bumps 64, the surface 261 of the dielectric layer 26, and portions of the exposed surface of the embedded trace layer 22 may be encapsulated by an encapsulant 62. In some embodiments, the electronic component 60 is electrically connected to the trace layer 22 of the patterned conductive layer of the interconnection structure 20. As such, the electronic carrier 1 is formed.

FIG. 6A1, FIG. 6A, FIG. 6B, FIG. 6C, and FIG. 6D illustrate various operations in a method of manufacturing an electronic carrier in accordance with some embodiments of the present disclosure.

Figure 6A:
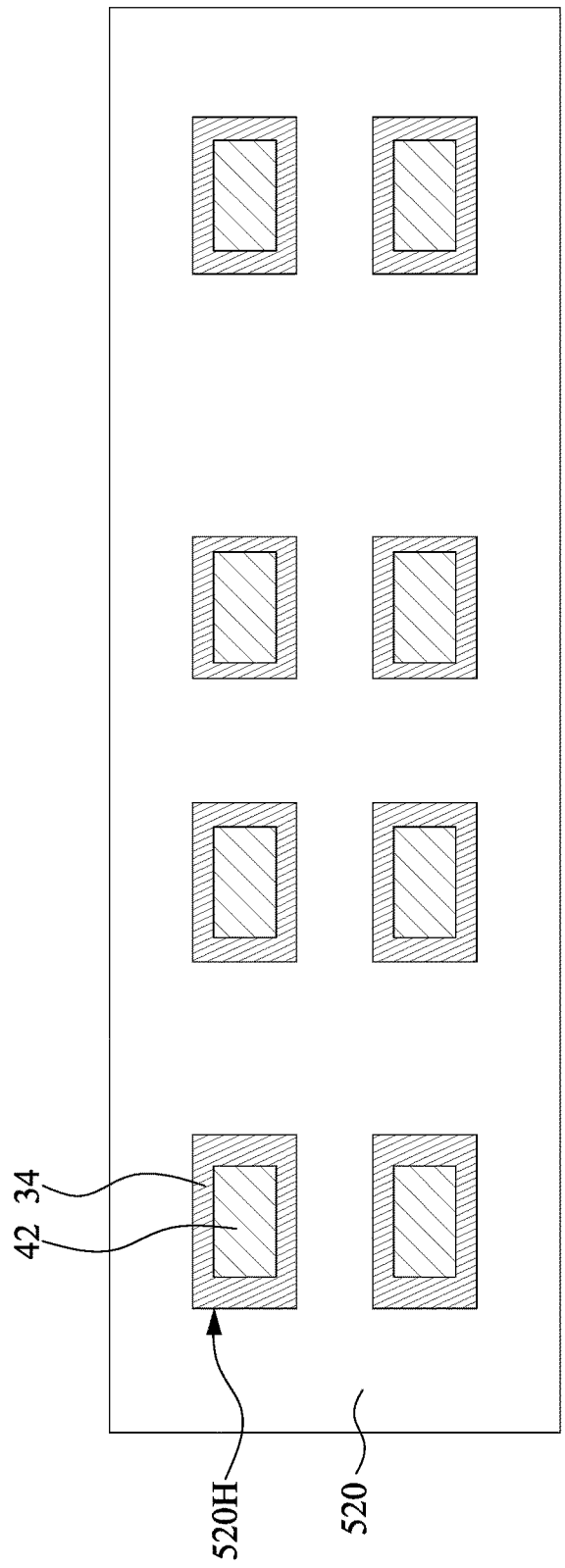
Figure 6A:
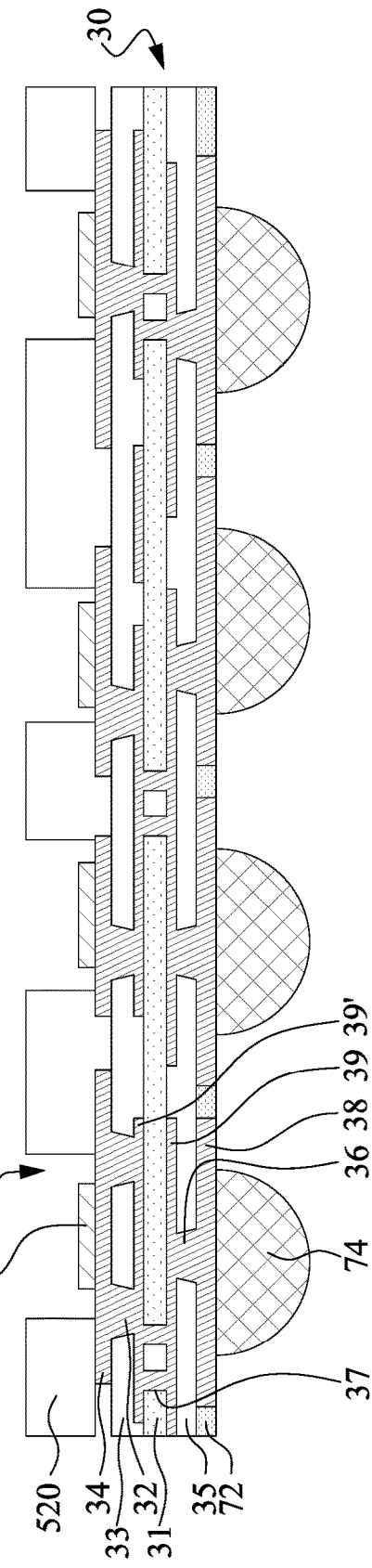

Referring to FIG. 6A, an interconnection structure 30 which includes an patterned conductive layer may be provided, a non-soldering joint 42 may be disposed on the interconnection structure 30, and a dielectric material layer (also referred to as "a binder material layer") 520 may be disposed around the non-soldering joint 42. In some embodiments, the interconnection structure 30 includes a core 31, dielectric layers 33 and 35 on opposite surfaces of the core 31, at least one interconnection via 37 passing through the core 31, at least one conductive via 32 passing through the dielectric layer 33, at least one conductive via 36 passing through the dielectric layer 35, conductive layers 34 and 39' connected to the conductive via 32, and conductive layers 38 and 39 connected to the conductive via 36. In some embodiments, electrical contacts 74 are disposed on the conductive layer 38, and a solder mask 72 is disposed on the dielectric layer 35.

Referring to FIG. 6A1, which illustrates a top view of the structure illustrated in FIG. 6A, in some embodiments, the dielectric material layer 520 defines at least one opening 520H exposing a portion of the interconnection structure 30. In some embodiments, the non-soldering joint 42 is disposed on the portion of the interconnection structure 30 exposed from the dielectric material layer 520. In some embodiments, the non-soldering joint 42 is disposed within the opening 520H of the dielectric material layer 520. In some embodiments, the non-soldering joint 42 include a plurality of paste portions, and the paste portions are disposed within the openings 520H of the dielectric material layer 520.

Figure 6B:
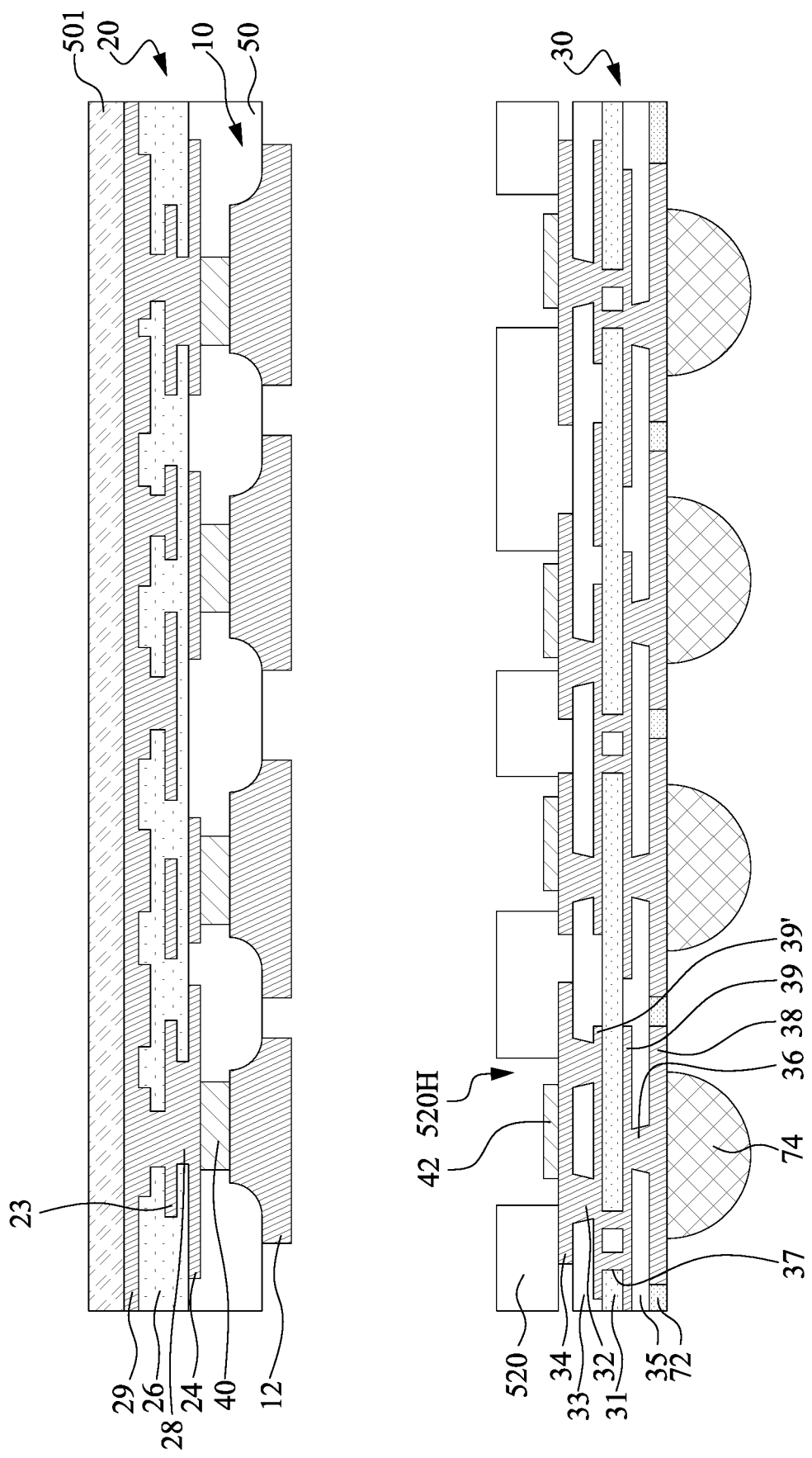

Referring to FIG. 6B, operations similar to those illustrated in FIGS. 5A-5D may be performed to form a structure including an interconnection structure 10 bonded to an interconnection structure 20 through a non-soldering joint 40 and a dielectric structure 50.

Figure 6C:
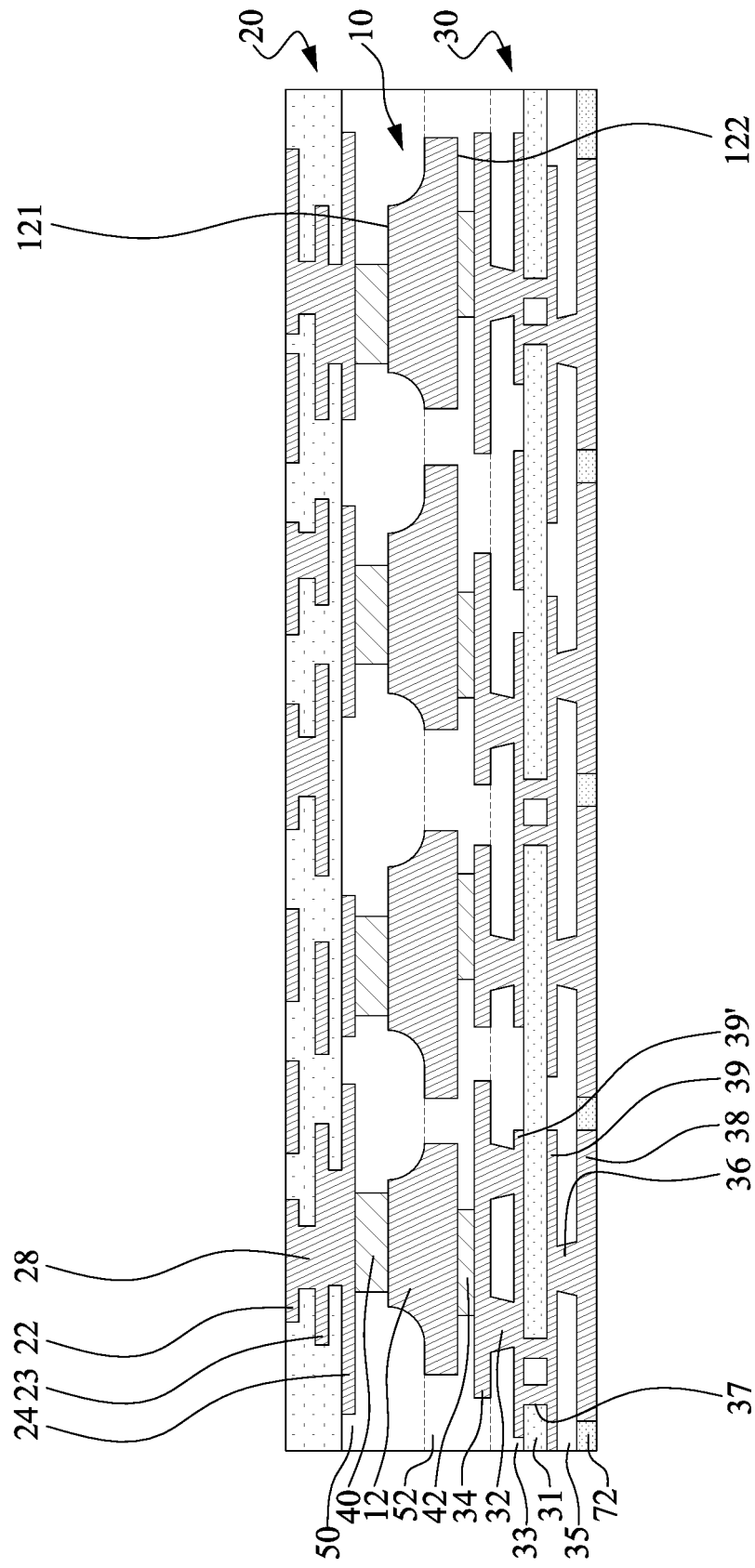

Referring to FIG. 6C, the structure including the interconnection structures 10 and 20 may be disposed on the non-soldering joint 42 to bond to the interconnection structure 30, and a curing operation may be performed on the non-soldering joint 42 and the dielectric material layer 520 to form a dielectric structure (also referred to as "a binder") 52 between the interconnection structure 10 and the interconnection structure 30. In some embodiments, the carrier 501 may be removed, and a portion of the conductive layer 29 may be removed to form a trace layer 22 embedded in the dielectric layer 26 and exposed from a surface 261 of the dielectric layer 26.

In some embodiments, performing the curing operation on the dielectric material layer 520 includes heating the dielectric material layer 520 under a temperature higher than a curing temperature of the non-soldering joint 42. In some embodiments, the temperature for curing the dielectric material layer 520 is higher than a curing temperature of the non-soldering joint 42 by about 10° C., 50° C., or 100° C. In some embodiments, the temperature for curing the dielectric material layer 520 is from about 180° C. to about 230° C. In some embodiments, the dielectric material layer 520 includes a resin and a plurality of reinforcing fibers dispersed in the resin.

In some embodiments, the dielectric material layer 520 may turn flowable during the curing operation. In some embodiments, the dielectric material layer 520 may turn flowable upon heating. Thus, the flowable dielectric material layer 520 may fill the voids/gaps between the interconnection structure 10 and the interconnection structure 30 and contact the non-soldering joint 42. In some embodiments, the non-soldering joint 42 and the dielectric material layer 520 are cured in the same operation.

Figure 6D:
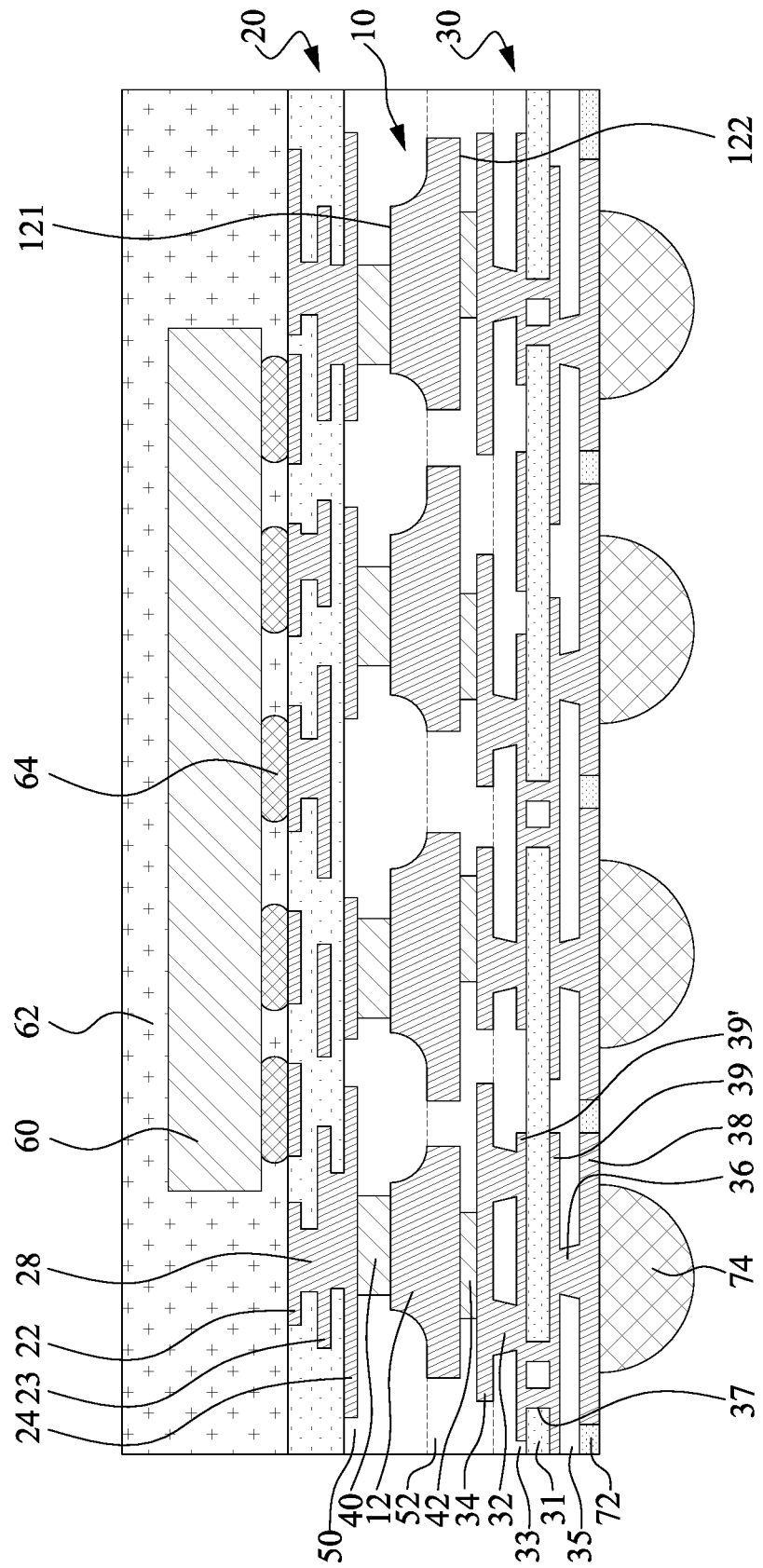

Referring to FIG. 6D, an electronic component 60 may be connected to the interconnection structure 20 through conductive bumps 64, and the electronic component 60, the conductive bumps 64, the surface 261 of the dielectric layer 26, and portions of the exposed surface of the embedded trace layer 22 may be encapsulated by an encapsulant 62. In some embodiments, the electronic component 60 is electrically connected to the trace layer 22 of the patterned conductive layer of the interconnection structure 20. As such, the electronic carrier 2 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic carrier, comprising:
a first interconnection structure comprising a first patterned conductive layer having a first pattern density; and
a second interconnection structure disposed over the first interconnection structure and comprising a second patterned conductive layer having a second pattern density higher than the first pattern density;
wherein the first interconnection structure is electrically connected to the second interconnection structure through a first non-soldering joint between and outside of the first interconnection structure and the second interconnection structure,
wherein the first interconnection structure comprises a conductive portion including a wide part and a narrow part between the wide part and the first non-soldering joint, and the narrow part contacts the first non-soldering joint,
wherein the narrow part has a width decreasing in toward the second interconnection structure,
wherein a lateral surface of the narrow part comprises a curved surface,
wherein the second interconnection structure comprises a conductive layer protruded beyond a surface of the second interconnection structure that faces the first interconnection structure,
wherein a thickness of the narrow part is greater than a thickness of the conductive layer,
wherein a portion of a bottom surface of the conductive layer is facing and exposed by the first non-soldering joint, and
wherein in a cross-sectional view perspective, a portion of a top surface of the narrow part facing and exposed by the first non-soldering joint has a first width, and the portion of the bottom surface of the conductive layer exposed by the first non-soldering joint has a second width greater than the first width.

2. The electronic carrier of claim 1, wherein the portion of the top surface of the narrow part exposed by the first non-soldering joint has a first region and a second region distinct from the first region, and a width of the first region is different from a width of the second region.

3. The electronic carrier of claim 1, wherein the conductive portion is a single layer, and a thickness of the conductive portion is greater than a thickness of the first non-soldering joint.

4. The electronic carrier of claim 3, further comprising a solder mask contacting the wide part and spaced apart from the top surface of the narrow part.

5. The electronic carrier of claim 1, further comprising a pad under the wide part, wherein a lateral surface of the pad is substantially aligned with a lateral surface of the wide part.

* * * * *